(12) United States Patent
Chae et al.

(10) Patent No.: US 10,951,033 B2
(45) Date of Patent: Mar. 16, 2021

(54) METHOD FOR CONTROLLING FREQUENCY OF STAND-ALONE MICROGRID AND POWER CONVERTER FOR ENERGY STORAGE DEVICE FOR CONTROLLING SAME

(71) Applicant: KOREA ELECTRIC POWER CORPORATION, Naju-si (KR)

(72) Inventors: Woo-Kyu Chae, Daejeon (KR); Hak-Ju Lee, Daejeon (KR); Jung-Sung Park, Daejeon (KR); Jong-Nam Weon, Daejeon (KR); Jun-Bo Sim, Daejeon (KR)

(73) Assignee: KOREA ELECTRIC POWER CORPORATION, Naju-si (KR)

( * ) Notice: Subject to any disclaimer, the term of this patent is extended or adjusted under 35 U.S.C. 154(b) by 55 days.

(21) Appl. No.: 16/327,310

(22) PCT Filed: Nov. 14, 2016

(86) PCT No.: PCT/KR2016/013070
§ 371 (c)(1),
(2) Date: Feb. 21, 2019

(87) PCT Pub. No.: WO2018/056504
PCT Pub. Date: Mar. 29, 2018

(65) Prior Publication Data
US 2019/0181643 A1    Jun. 13, 2019

(30) Foreign Application Priority Data
Sep. 20, 2016    (KR) .................. 10-2016-0120112

(51) Int. Cl.
*H02J 3/32*    (2006.01)
*H02J 3/38*    (2006.01)
(Continued)

(52) U.S. Cl.
CPC .............. *H02J 3/32* (2013.01); *G01R 31/387* (2019.01); *H02J 3/38* (2013.01); *H02J 3/382* (2013.01);
(Continued)

(58) Field of Classification Search
CPC ...... H02J 3/38; H02J 3/32; H02J 3/388; H02J 3/382; Y02E 70/30; Y02E 40/10; G05B 19/042; G05B 2219/2639; G01R 31/387
See application file for complete search history.

(56) References Cited

U.S. PATENT DOCUMENTS

| | | | |
|---|---|---|---|
| 2011/0175443 A1* | 7/2011 | Koyanagi | H02J 3/383 307/21 |
| 2016/0118795 A1* | 4/2016 | Berkowitz | H02J 3/32 700/286 |

FOREIGN PATENT DOCUMENTS

| | | |
|---|---|---|
| JP | 2012-249500 A | 12/2012 |
| JP | 2014-197955 A | 10/2014 |

(Continued)

OTHER PUBLICATIONS

Ioan Serban et al, "Energy storage systems impact on the short-term frequency stability of distributed autonomous microgrids, an analysis using aggregate models", IET Renew. Power Gener., 2013, pp. 531-539, vol. 7,Iss. 5.

*Primary Examiner* — Jared Fureman
*Assistant Examiner* — Duc M Pham
(74) *Attorney, Agent, or Firm* — Foundation Law Group, LLP

(57) ABSTRACT

The present invention relates to a method for controlling the frequency of a stand-alone microgrid wherein an energy storage device of the stand-alone microgrid is operated as a main power source by controlling a battery power conditioning system (PCS) of the stand-alone microgrid in a constant voltage constant frequency (CVCF) mode. Accord- (Continued)

ing to the present invention, it is possible to operate the frequency stably while considering the fuel cost and power generation efficiency of a stand-alone microgrid.

6 Claims, 8 Drawing Sheets

(51) Int. Cl.
  *G01R 31/387* (2019.01)
  *G05B 19/042* (2006.01)
  *G01R 31/382* (2019.01)

(52) U.S. Cl.
  CPC .......... *G01R 31/382* (2019.01); *G05B 19/042* (2013.01); *G05B 2219/2639* (2013.01); *Y02E 40/10* (2013.01); *Y02E 70/30* (2013.01)

(56) References Cited

FOREIGN PATENT DOCUMENTS

| | | |
|---|---|---|
| JP | 2015-186411 A | 10/2015 |
| JP | 2016-001967 A | 1/2016 |
| JP | 2016-039685 A | 3/2016 |
| KR | 10-2015-0019821 A | 2/2015 |
| KR | 10-1545060 B1 | 8/2015 |
| KR | 10-2016-0081216 A | 7/2016 |
| KR | 20160081216 A * | 7/2016 ................ H02J 3/46 |

* cited by examiner

METHOD FOR CONTROLLING FREQUENCY OF STAND-ALONE MICROGRID AND POWER CONVERTER FOR ENERGY STORAGE DEVICE FOR CONTROLLING SAME

CROSS REFERENCE TO RELATED PATENT APPLICATION

This application claims the benefit under 35 U.S.C. Section 371, of PCT International Application No. PCT/KR2016/013070, filed on Nov. 14, 2016, which claimed priority to Korean Patent Application No. KR 10-2016-0120112, filed on Sep. 20, 2016, the disclosures of which are hereby incorporated by the references.

TECHNICAL FIELD

The present invention relates to a method of controlling frequency of a stand-alone microgrid for power supply operation and a power conditioning system for an energy storage device for controlling the same.

BACKGROUND ART

Recently, in most island area systems, a power supply network is operated in such a manner that power is supplied by using a plurality of small diesel generators, but in addition to fuel costs, it is costly to store and manage fuel.

Therefore, when a new renewable energy source such as solar power or wind power is utilized, economical efficiency can be secured, but the output of the new renewable energy source highly fluctuates, whereby a battery energy storage system (BESS) is necessary.

Thus, as shown in FIG. 1, the power source of a stand-alone microgrid is comprised of a battery, a diesel generator, a solar power source, a wind power generator, and the like.

The stand-alone microgrid has a diesel generator as a main power source to secure the power supply reliability and controls the voltage and frequency using a governor and an automatic voltage regulator (AVT) mounted on the diesel generator.

In this case, the battery is used to compensate for the output fluctuation of the new renewable energy, by charging surplus electric power and discharging the charged electric power at the time of the peak load.

Such a battery operates in a PQ operation mode in which the output of the battery is controlled, and a power conditioning system (PCS) for the battery controls the output current in synchronization to the system voltage controlled by the diesel generator by using a phased-locked loop (PLL) as shown in FIG. 2.

The BESS, which constitutes a stand-alone microgrid, is provided with a smaller capacity compared to a diesel generator. In general, the BESS plays an auxiliary role to compensate for sudden fluctuations in the output of the new renewable energy source and is restrictively used to compensate frequency when there is enough output.

When such stand-alone microgrid in the related art has a large capacity of new renewable energy and a large output fluctuation, there is frequent transfer of control between the diesel generator and the BESS, whereby frequency synchronization between the power sources is difficult and excessive disturbance may occur in the system.

In addition, since the stand-alone microgrid in the related art mainly uses a diesel generator to generate electricity, there are problems that fuel costs are high, it is difficult to store and manage fuel, and power generation efficiency is low compared to a mainland system due to small-scale power generation.

The matters described in the background art are intended to aid understanding of the background of the invention and may include matters not previously known to those skilled in the art.

DISCLOSURE

Technical Problem

The present invention has been made to solve the above-mentioned problems, and it is an object of the present invention to provide a method of controlling frequency of a stand-alone microgrid and a power conditioning system for an energy storage device for controlling the same, which enable a stable operating frequency while considering fuel cost and power generating efficiency of the stand-alone microgrid.

Technical Solution

A method of controlling frequency of a stand-alone microgrid according to an aspect of the present invention is provided such that an energy storage device of the stand-alone microgrid is operated as a main power source by controlling a battery power conditioning system (PCS) of the stand-alone microgrid in a constant voltage constant frequency (CVCF) mode.

The battery PCS may compensate for surplus power and insufficient power of the microgrid system, thereby operating the energy storage device as a main power source.

In addition, the method may include measuring a state of charge (SOC) of the energy storage device; comparing the SOC measured in the measuring of the SOC with a predetermined reference; and controlling cutoff or input of a controllable load in the microgrid according to a result of the comparison of the SOC with the predetermined reference.

In addition, the comparing of the SOC measured in the measuring of the SOC with the predetermined reference may be performed by comparing the SOC with a lower reference 1, and when the SOC is lower than the lower reference 1 as a result of comparing of the SOC with the lower reference 1, the controlling of cutoff or input of the controllable load in the microgrid may be performed to cut off the controllable load.

In addition, the method may further include measuring the battery SOC after performing cutoff of the controllable load; comparing the measured SOC with a lower reference 2 that is less than the lower reference 1; and when the SOC is lower than the lower reference 2 as a result of the comparison with the lower reference 2, controlling operation of a diesel generator in the microgrid.

In addition, the SOC of the energy storage device may be measured again after elapse of a predetermined time after the diesel generator is operated in the controlling of the operation of the diesel generator in the microgrid.

Further, when the SOC is greater than the lower reference 2 as a result of the comparing of the SOC with the lower reference 2, the SOC may be compared with the lower reference 1 again.

In addition, the comparing of the SOC measured in the measuring of the SOC with the predetermined reference may be performed by comparing the SOC with an upper reference 1, and when the SOC is greater than the upper reference 1 as a result of the comparing of the SOC with the upper reference 1, the controlling of cutoff or input of the controllable load in the microgrid may be performed to input the controllable load.

Further, the method may further include measuring the battery SOC after performing input of the controllable load; comparing the measured SOC with an upper reference 2 that is greater than the upper reference 1; and when the SOC is greater than the upper reference 2 as a result of the comparing of the SOC with the upper reference 2, limiting an output of a new renewable energy source in the microgrid In addition, the SOC of the energy storage device may be measured again after elapse of a predetermined time after the output of the new renewable energy source is limited in the limiting of the output of the new renewable energy source in the microgrid.

In addition, when the SOC is lower than the upper reference 2 as a result of the comparing of the SOC with the upper reference 2, the SOC may be compared to the upper reference 1 again.

A method of controlling frequency of a stand-alone microgrid according to another aspect of the present invention is provided such that a charging/discharging amount of an energy storage device is received through a control means formed in a battery power conditioning system (PCS) of the stand-alone microgrid, and frequency of the microgrid system is controlled in accordance with the received charging/discharging amount of the energy storage device, thereby operating the energy storage device as a main power source of the stand-alone microgrid.

In addition, the method may include controlling the battery PCS in a constant voltage constant frequency (CVCF) mode; measuring a state of charge (SOC) of the energy storage device; comparing the SOC measured in the measuring of the SOC with a predetermined reference; and controlling cutoff or input of a controllable load in the microgrid according to a result of the comparing of the SOC with the predetermined reference.

In addition, the method may further include measuring the SOC after the controlling of cutoff or input of the controllable load, wherein when the measured SOC is out of the predetermined reference, the frequency of the microgrid system may be controlled according to the received charging/discharging amount of the energy storage device.

In addition, frequency of the battery PCS may be controlled by deriving an equivalent stiffness of the entire microgrid system according to an input of the charging/discharging amount of the energy storage device.

In addition, a power conditioning system (PCS) for an energy storage device of a stand-alone microgrid according to an aspect of the present invention is provided such that an energy storage device of the stand-alone microgrid is operated as a main power source by controlling a battery PCS of the stand-alone microgrid in a constant voltage constant frequency (CVCF) mode.

A state of charge (SOC) of the energy storage device may be measured, the measured SOC may be compared with a predetermined reference, and cutoff or input of a controllable load in the microgrid may be controlled according to a result of the comparison.

In addition, a charging/discharging amount of the energy storage device may be input by a control means, and the frequency of the microgrid system may be controlled according to the received charging/discharging amount of the energy storage device.

In addition, frequency of the battery PCS may be controlled by deriving an equivalent stiffness of the entire microgrid system according to an input of the charging/discharging amount of the energy storage device.

Advantageous Effects

According to the method of controlling frequency of a stand-alone microgrid and the power conditioning system for an energy storage device for controlling the same, the frequency and voltage are controlled according to SOC, by operating the BESS using the new renewable energy as the main power source and by supplementarily using the internal combustion power generator, whereby it is possible to perform optimal power control so that demand and supply are matched to each other, that is, the surplus power of the microgrid becomes zero.

In this case, since the SOC of the BESS is maintained within the reference set range, the number of charging/discharging cycles of the BESS is reduced and the life of the BESS can be extended.

In addition, it is possible to reduce the use of the internal combustion power generator and thus use the new renewable energy as the main power source while reducing the fuel cost according to the use of the internal combustion power generator, thereby minimizing the cost.

By calculating and providing a target drop frequency of the output frequency using a droop characteristic of the diesel generator, an operator can control the output frequency of the BESS automatically or manually by the calculated target frequency.

BEST MODE

In order to fully understand operational advantages of the present invention and objects achieved by the practice of the present invention, reference should be made to the accompanying drawings which illustrate preferred embodiments of the present invention and contents described in the accompanying drawings.

In describing the preferred embodiments of the present invention, a description of known or repeated descriptions that may unnecessarily obscure the gist of the present invention will be reduced or omitted.

A stand-alone microgrid proposed in the present invention is configured so that the use of a diesel generator is minimized as much as possible and a battery is operated as the main power source.

Theoretically, the diesel generator is designed to operate only when the power is not normally supplied by using energy stored in the battery due to an extreme weather event or a fault of new renewable energy source.

In this case, the operation of the battery performs control to make a waveform of the output voltage by internally generating phase without using a PLL, which is defined as a constant voltage constant frequency (CVCF) mode in which the voltage and frequency of the system are constantly controlled.

Figure 1:
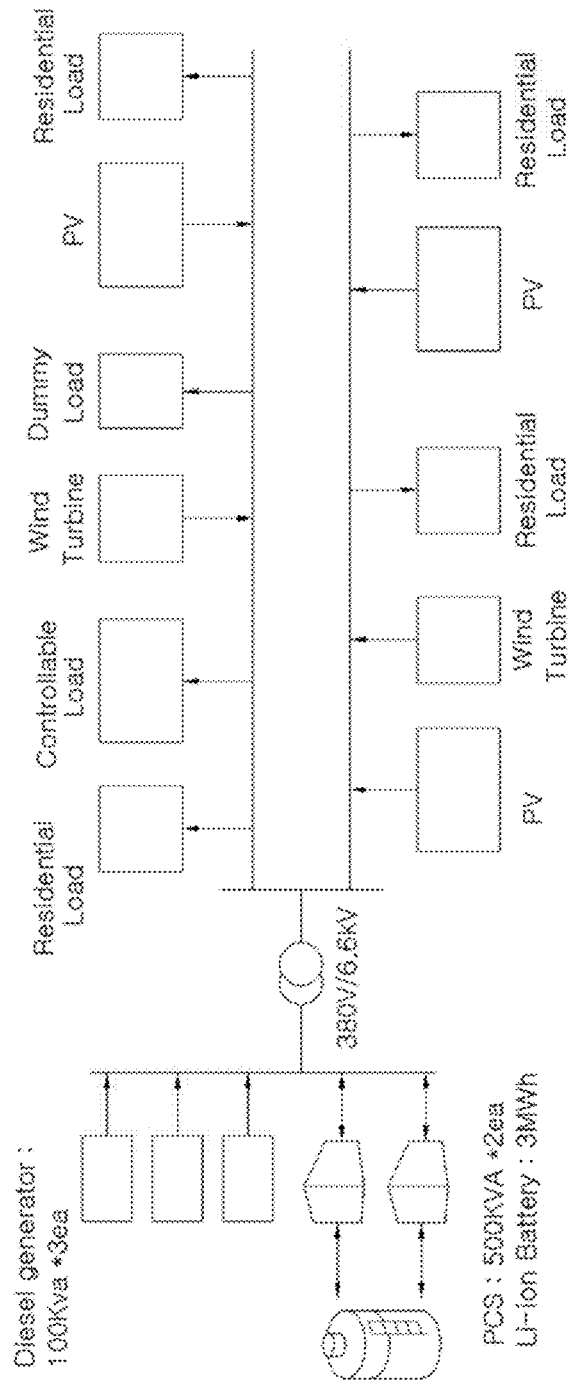
FIG. 1 is a view illustrating a power supply configuration of a stand-alone microgrid.
Figure 2:
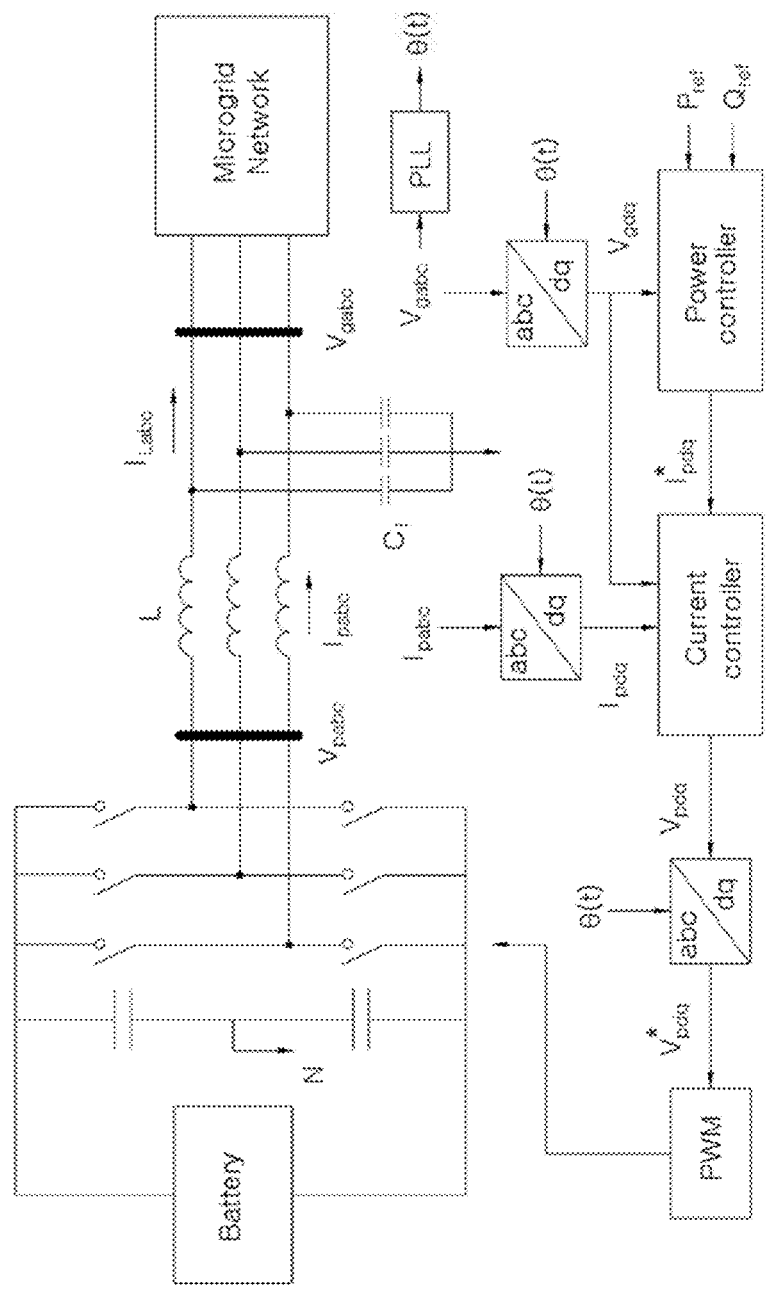
FIG. 2 is a view illustrating a phase follower circuit applied to a PCS for a battery.
Figure 3:
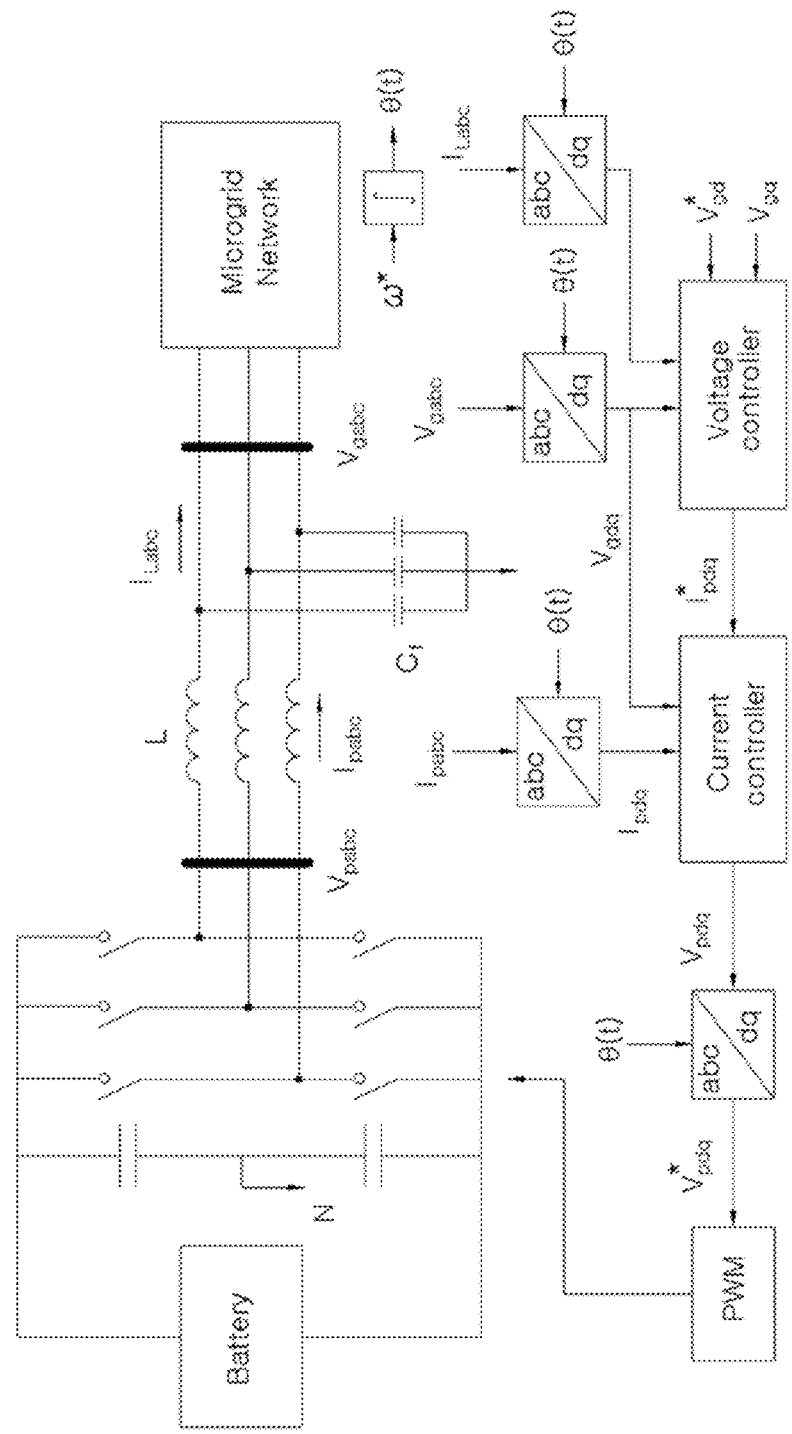
FIG. 3 is a view illustrating a configuration of a controller in CVCF mode for a battery PCS.

A configuration of the controller in the CVCF mode for the designed battery PCS is shown in FIG. 3.

Accordingly, when the power charged in the battery is stably maintained, the frequency of the stand-alone microgrid may be constantly controlled to the rated frequency (60 Hz).

This may be implemented by allowing the battery PCS instantly to compensate for surplus power and insufficient power of the microgrid system.

The power stored in the battery may be determined by measuring a state of charge (SOC).

Figure 4:
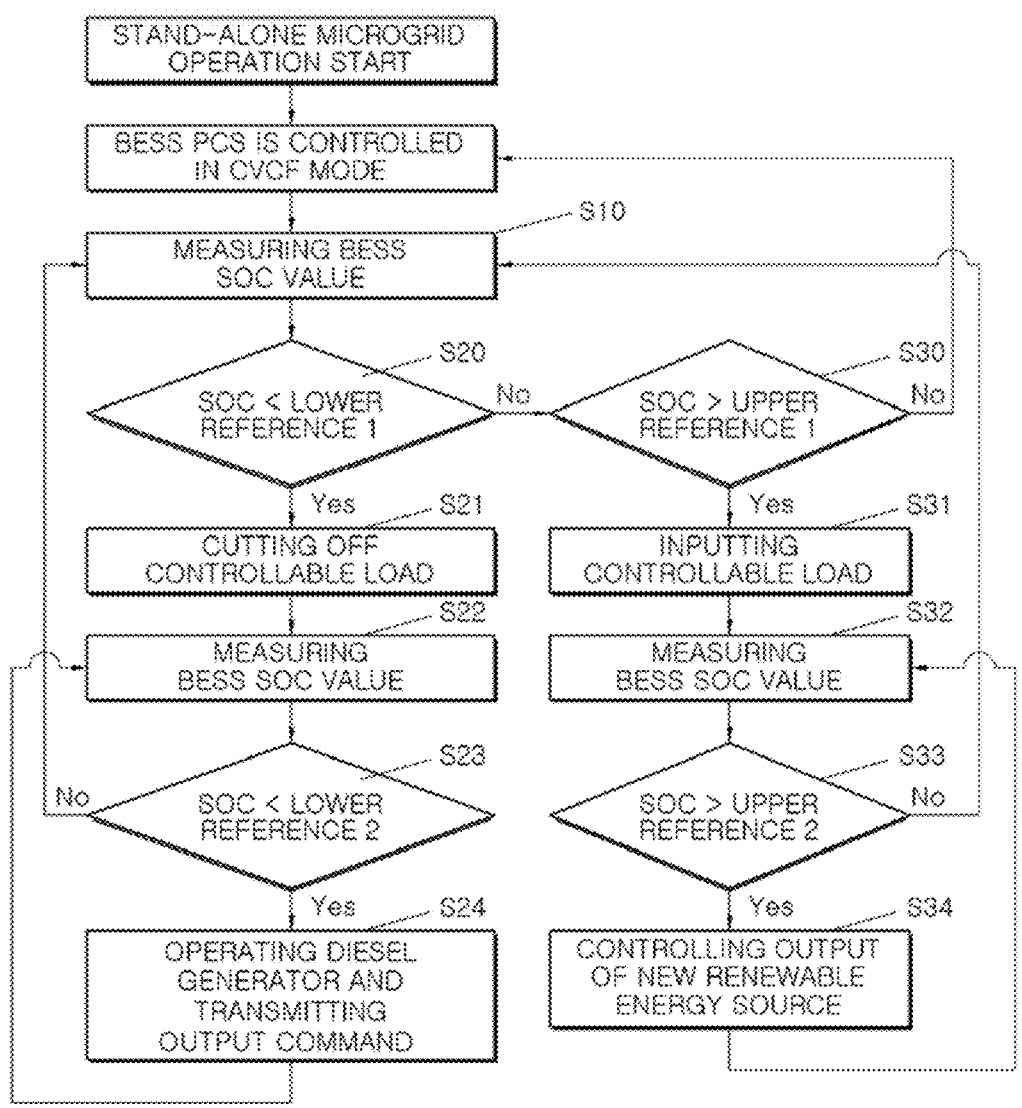
FIG. 4 is a flow diagram illustrating a method of operating frequency of a stand-alone microgrid according to the present invention.

That is, the automatic frequency control of the stand-alone microgrid of the battery PCS is performed according to a value of SOC, and the control operation thereof is as shown in FIG. 4.

Figure 5:
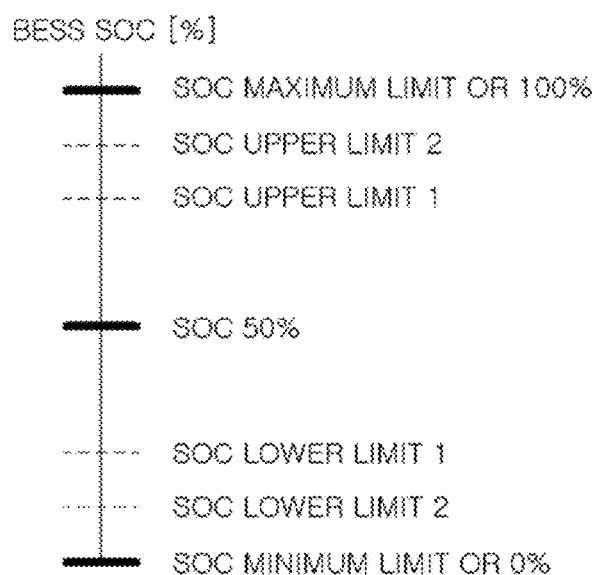
FIG. 5 is a view illustrating references of BESS SOC for controlling frequency of a stand-alone microgrid according to the present invention.

Upper and lower references shown in FIG. 4 are as shown in FIG. 5. As shown, the upper and lower references 1 mean a relatively safe area than the upper and lower references 2 and serve as references for utilizing the controllable load at the maximum The upper and lower references 2 are the maximum and minimum values of the safe region that enable the battery SOC not to reach a dangerous value, respectively.

It is preferable to use 80 to 90% as the upper reference and 20 to 30% as the lower reference.

Figure 6:
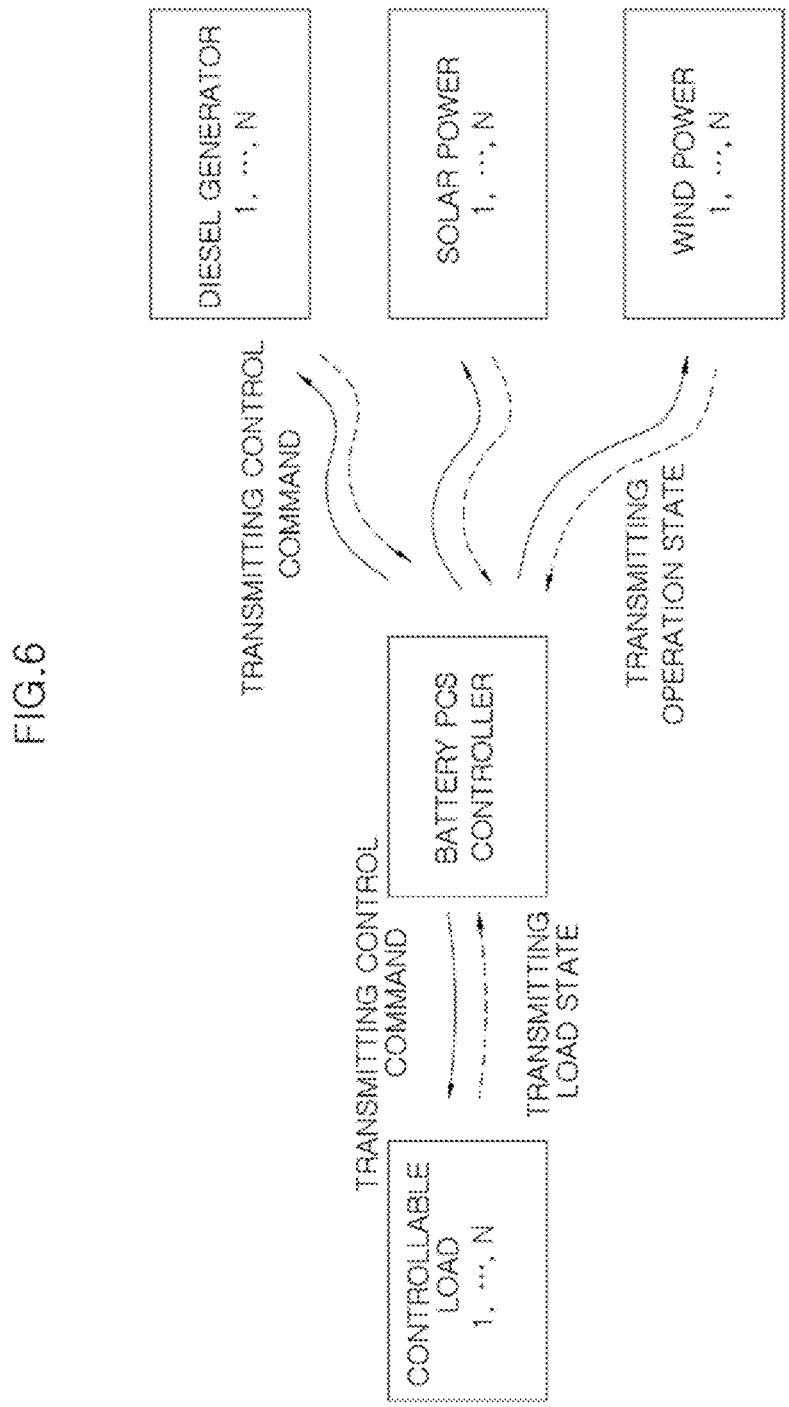
FIG. 6 is a view illustrating a relationship between configurations for implementing an automatic frequency control principle.

FIG. 6 illustrates communication connections between the battery PCS and other devices to implement the automatic frequency control principle. In other words, the battery PCS is configured to communicate with the diesel generator and the new renewable energy source, thereby receiving the operating state and transmitting the control command, and communicate with the controllable load, thereby receiving the load state and transmitting the control command.

When the operation of the stand-alone microgrid starts, the battery PCS performs control in the CVCF mode and measures a SOC value of the battery (S10).

It is determined whether the measured SOC value of the battery is less than the lower reference 1 (S20). When the measured SOC value is lower than the lower reference 1, in order to allow the frequency fluctuation to be minimized by maintaining the state of SOC at the maximum, first, the controllable load is cut off (S21).

The controllable load is cut off, and then the SOC value of the battery is measured (S22). As a result of the measurement, it is determined that the battery SOC is less than the lower reference 2 (S23), and when the SOC is less than the lower reference 2, the SOC is determined to be in the danger area so that an output command for activating the diesel generator is transmitted (S24).

After the command is transmitted, the battery SOC is measured to continuously check whether the SOC has a value greater than the lower reference 2. As a result of the determination in step S23, when the battery SOC is greater than the lower reference 2, the battery SOC is measured again to perform the comparison with the lower reference 1 in the step S20.

On the other hand, when the battery SOC is greater than the lower reference 1 as a result of the step S20, the battery SOC value is compared with the upper reference 1 (S30).

As a result of the comparison, when the battery SOC value is greater than the upper reference 1, the battery may be stably controlled as the main power source so that controllable load is input (S31).

Then, the battery SOC value is measured (S32) to perform comparison with the upper reference 2 (S33), and as a result of the comparison, when the battery SOC is greater than the upper reference 2, the battery SOC is in an excess state so that the output of the new renewable energy source is limited (S34).

After the output is limited, the battery SOC is measured to continuously check whether the SOC has a value higher than upper reference 2. As a result of the determination in the step S33, when the battery SOC is smaller than the upper reference 2, the SOC is measured again to perform the comparison with the upper reference 1 in the step S30.

As described above, the automatic frequency control using the battery PCS has an advantage that the frequency of the stand-alone microgrid may be constantly controlled in a stable manner. For the automatic frequency control, communication between the battery PCS and each of the distributed power source and the controllable load is required to maintain the battery SOC in a stable range. Although the communication is the most stable when using a dedicated wire line, when problems occur in communication line or communication equipment, there is a problem that the SOC value of the battery may not be maintained in a stable area.

In this case, the present invention proposes a manual frequency control function for the battery PCS.

That is, the control function is possible by providing a manual control means (a switch, a lever, a knob, etc.) for maintaining the battery SOC at a place, such as a battery PCS panel, to which an operator easily may access.

In this way, an operator may precisely specify the charging/discharging power of the battery to a specific value through the control means in order to maintain the battery SOC, whereby the frequency may be controlled.

Considering the principle of the manual control, it is noted that the manual control is divided into a case when the SOC rises and a case when the SOC rises.

When the battery SOC continuously increases even after the SOC of the battery becomes greater than the upper reference 2, this means that the automatic frequency control does not operate properly. This case needs a manual control means that enables the operator to manually stop the new renewable energy source and the diesel generator.

Herein, the operator may accurately input the battery charging/discharging power value to be maintained by using the control means, and the new renewable energy source and the diesel generator are not re-input until the power value is satisfied.

When the battery SOC continuously decreases even after the SOC of the battery becomes smaller than the lower reference 2, this also means that the automatic frequency control does not operate properly. In this case, the operator may also control the SOC manually using the control means.

The control principle is due to the following characteristics of the power system.

When the frequency of the power system is lowered, 1) the output of the diesel generator performing the droop control increases, and 2) the load is lowered according to the frequency sensitivity of the load.

The process of 1) may be expressed by the following Equation 1.

$$\Delta P_G = -\frac{\Delta f}{R_{eq}} \quad \text{[Equation 1]}$$

Herein, $\Delta P_G$ is a change amount of the power generation amount in the microgrid, and when a value of $\Delta P_G$ is a positive number, this means an increase in power generation amount, and when a value of $\Delta P_G$ is a negative number, this means a decrease in power generation amount.

$\Delta f$ is a frequency fluctuation amount, and when it is a positive number, this means a rise in frequency, and when it is a negative number, this means a decrease in frequency, and $R_{eq}$ means an equivalent droop coefficient in the operating state.

Since the frequency of the microgrid system is controlled by the battery PCS, the output of other power sources in the microgrid system may be indirectly controlled without communication by changing the frequency. Therefore, when the equivalent droop coefficient may be obtained accurately, the output of the other power source may be accurately controlled, thereby charging the battery.

The process of 2) may be expressed by the following Equation 2.

$$\Delta P_D = D_{eq}\Delta f \quad \text{[Equation 2]}$$

$\Delta P_D$ is a variation of a frequency-sensitive load. Generally, when the frequency is reduced, a size of the load is also reduced, and when the frequency is increased, a size of the load also increases proportionally.

$D_{eq}$ is an equivalent frequency sensitivity factor of the load.

When the processes of 1) and 2) are shown together, the battery charging/discharging amount with respect to the frequency variation amount may be expressed by Equation 3 and Equation 4.

$$\Delta P_{BESS} = \Delta P_G - \Delta P_D = \left(=\frac{1}{R_{eq}} - D_{eq}\right)\Delta f = -\beta_{eq}\Delta f \quad \text{[Equation 3]}$$

$$\beta_{eq} = \frac{1}{R_{eq}} + D_{eq} \quad \text{[Equation 4]}$$

Figure 7:
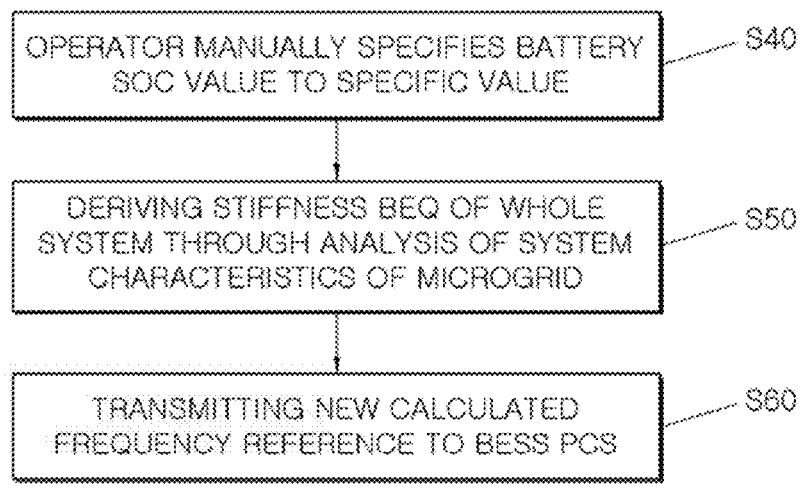
FIG. 7 is a flow diagram illustrating a method relating to frequency adjustment.

FIG. 7 is a flow diagram illustrating the above process.

The operator manually specifies the battery SOC value to a specific value (S40).

Performing manual control means a situation in which the control of another power source may be unreliable through communication. Therefore, it is not possible to check through communication how many diesel generators are properly supplying power to the current system. That is, no information on the $R_{eq}$ value is given.

Accordingly, an equivalent stiffness of the whole system is derived through the analysis of the system characteristics of the microgrid (S50). This may be obtained from Equation 3. By adding a small amount of change, which is only a few percent of the frequency command value, is added, and measuring the change in the charging/discharging amount of the battery at that time, it is possible to obtain $\beta_{eq}$. That is, when the SOC value of the battery or the charging/discharging power is determined according to the manual control means of the operator, the frequency command value of the battery PCS is changed (S60), thereby achieving the desired object.

There is a problem that the frequency fluctuates in entire microgrid system according to the adjustment of the control command of the battery PCS, so it is important to prevent a physical failure of the battery in advance. When the frequency fluctuation amount is stably managed in a certain range, it is difficult to minimize an influence on the power system.

Figure 8:
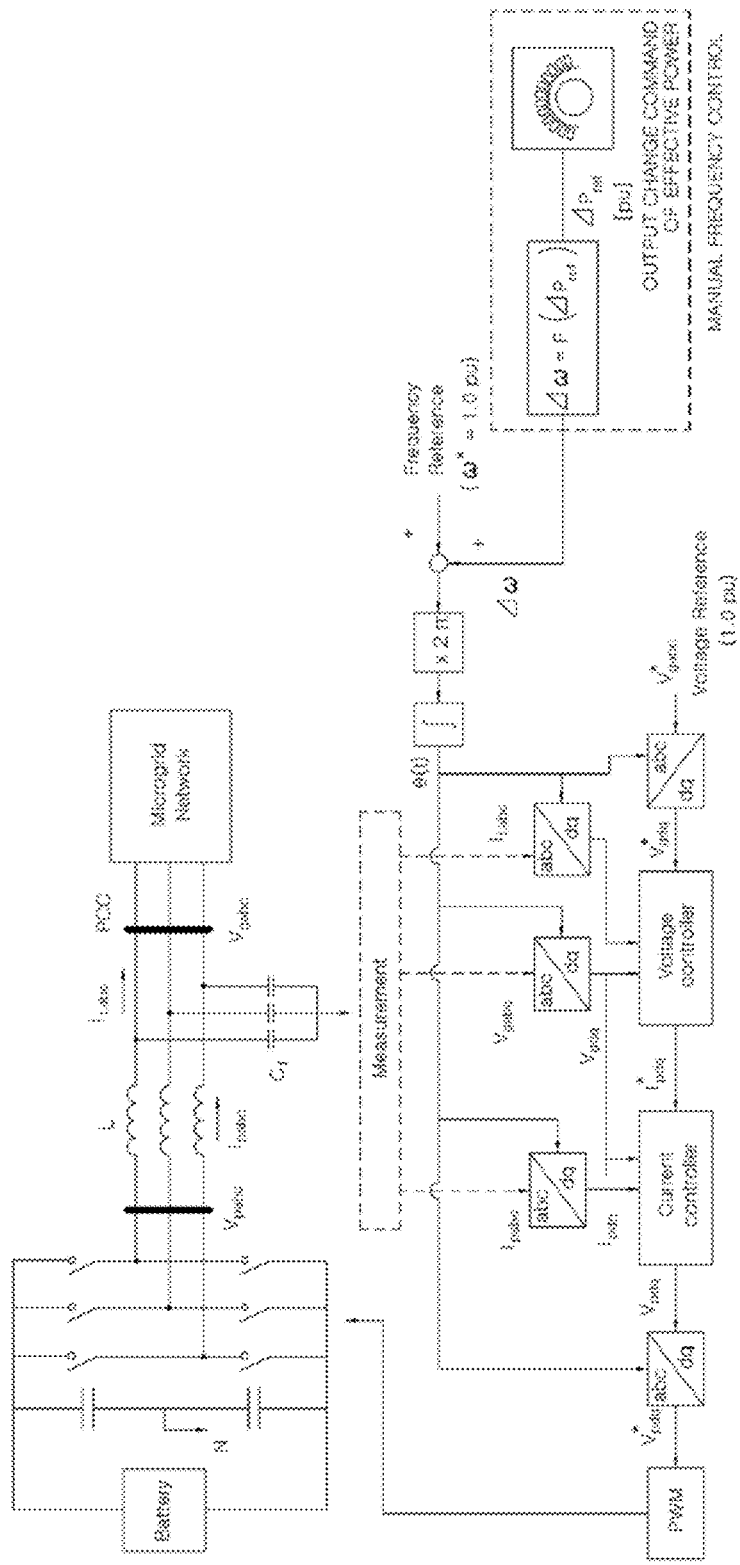
FIG. 8 is a view illustrating an association with a PCS controller by manual frequency control.

FIG. 8 shows a method of associating a frequency manual control result with a controller of a battery PCS. In this case, the charging/discharging power $\Delta P_{ref}$ set by the operator and the frequency control command fluctuation amount $\Delta\omega(=\Delta f)$ may be obtained from Equation 3 as shown in Equation 5 below.

$$\Delta\omega = \Delta f = -\frac{\Delta P_{ref}}{\beta_{eq}} \quad \text{[Equation 5]}$$

While the present invention has been described with reference to exemplary embodiments, it will be obvious to those of ordinary skill that the invention is not limited to the disclosed exemplary embodiments. On the contrary, is intended to cover various modifications and alternative arrangements included within the spirit and scope of the invention. Accordingly, it is intended that the present invention covers the modifications and variations of this invention provided they fall within the scope of the appended claims and their equivalents.

DESCRIPTION OF REFERENCE NUMERALS

S10: measuring battery SOC
S20: comparing SOC with lower reference 1
S21: cutting off controllable load
S22: measuring battery SOC
S23: comparing SOC with lower reference 2
S24: transmitting command to operate diesel generator
S30: comparing SOC with upper reference 1
S31: inputting controllable load
S32: measuring battery SOC
S33: comparing SOC with upper reference 2
S34: controlling output of new renewable energy source

The invention claimed is:

1. A method of controlling frequency of a stand-alone microgrid,
wherein a charging/discharging amount of an energy storage device is received through a control means formed in a battery power conditioning system (PCS) of the stand-alone microgrid, and frequency of the microgrid system is controlled in accordance with the received charging/discharging amount of the energy storage device, thereby operating the energy storage device as a main power source of the stand-alone microgrid, and
wherein frequency of the battery PCS is controlled by deriving an equivalent stiffness of the entire microgrid system according to an input of the charging/discharging amount of the energy storage device.

2. The method of claim 1, comprising:
controlling the battery PCS in a constant voltage constant frequency (CVCF) mode;
measuring a state of charge (SOC) of the energy storage device;
comparing the SOC measured in the measuring of the SOC with a predetermined reference; and
controlling cutoff or input of a controllable load in the microgrid according to a result of the comparing of the SOC with the predetermined reference.

3. The method of claim 2, further comprising:

measuring the SOC after the controlling of cutoff or input of the controllable load, wherein when the measured SOC is out of the predetermined reference, the frequency of the microgrid system is controlled according to the received charging/discharging amount of the energy storage device.

4. A power conditioning system (PCS) for an energy storage device of a stand-alone microgrid, wherein an energy storage device of the stand-alone microgrid is operated as a main power source by controlling a battery PCS of the stand-alone microgrid in a constant voltage constant frequency (CVCF) mode, and wherein frequency of the battery PCS is controlled by deriving an equivalent stiffness of the entire microgrid system according to an input of the charging/discharging amount of the energy storage device.

5. The system of claim 4, wherein a state of charge (SOC) of the energy storage device is measured, the measured SOC is compared with a predetermined reference, and cutoff or input of a controllable load in the microgrid is controlled according to a result of the comparison.

6. The system of claim 5, wherein a charging/discharging amount of the energy storage device is input by a control means, and the frequency of the microgrid system is controlled according to the received charging/discharging amount of the energy storage device.

* * * * *